United States Patent
Hynes et al.

(10) Patent No.: US 10,280,349 B2
(45) Date of Patent: May 7, 2019

(54) 1K UV AND THERMAL CURE HIGH TEMPERATURE DEBONDABLE ADHESIVE

(71) Applicants: Henkel IP & Holding GmbH, Duesseldorf (DE); Henkel AG & Co. KGaA, Duesseldorf (DE)

(72) Inventors: Stephen Hynes, Dublin (IE); Chunyu Sun, Shanghai (CN); Jiangbo Ouyang, Wallingford, CT (US); John Gregory Woods, Farmington, CT (US); Bahram Issari, Glastonbury, CT (US); Shengqian Kong, Hillsborough, NJ (US); Yayun Liu, Franklin Park, NJ (US); Wenhua Zhang, Farmington, CT (US)

(73) Assignees: Henkel AG & Co. KGaA, Duesseldorf (DE); Henkel IP & Holding GmbH, Duesseldorf (DE)

( * ) Notice: Subject to any disclaimer, the term of this patent is extended or adjusted under 35 U.S.C. 154(b) by 122 days.

(21) Appl. No.: 15/371,601

(22) Filed: Dec. 7, 2016

(65) Prior Publication Data

US 2017/0081574 A1 Mar. 23, 2017

Related U.S. Application Data

(63) Continuation of application No. PCT/CN2014/080578, filed on Jun. 24, 2014.

(51) Int. Cl.
| | | |
|---|---|---|
| *C09J 5/06* | (2006.01) | |
| *C09J 183/04* | (2006.01) | |
| *C09J 183/14* | (2006.01) | |
| *C08K 3/36* | (2006.01) | |
| *C08G 77/12* | (2006.01) | |
| *C08G 77/20* | (2006.01) | |
| *C08K 5/54* | (2006.01) | |
| *C08K 5/14* | (2006.01) | |
| *C08L 83/00* | (2006.01) | |
| *H01L 21/683* | (2006.01) | |
| *H01L 27/12* | (2006.01) | |
| *C08K 5/00* | (2006.01) | |
| *C08K 5/07* | (2006.01) | |
| *C08K 5/56* | (2006.01) | |
| *C08G 77/52* | (2006.01) | |
| *C08G 77/50* | (2006.01) | |

(52) U.S. Cl.
CPC ........... *C09J 183/14* (2013.01); *C08K 3/36* (2013.01); *C08K 5/0025* (2013.01); *C08K 5/07* (2013.01); *C08K 5/56* (2013.01); *C08L 83/00* (2013.01); *C09J 5/06* (2013.01); *C09J 183/04* (2013.01); *H01L 21/6835* (2013.01); *H01L 27/1259* (2013.01); *C08G 77/12* (2013.01); *C08G 77/20* (2013.01); *C08G 77/50* (2013.01); *C08G 77/52* (2013.01); *C09J 2205/302* (2013.01); *C09J 2205/31* (2013.01); *C09J 2483/00* (2013.01)

(58) Field of Classification Search
USPC ...... 156/247, 307.1, 307.3, 307.9, 325, 326, 156/329, 331, 701, 714
See application file for complete search history.

(56) References Cited

U.S. PATENT DOCUMENTS

| | | | |
|---|---|---|---|
| 3,438,936 A * | 4/1969 | Lamoreaux | C08G 77/50 528/15 |
| 4,908,086 A | 3/1990 | Goodrich et al. | |
| 5,256,717 A | 10/1993 | Stauffer et al. | |
| 5,278,276 A | 1/1994 | Ohta et al. | |
| 8,092,628 B2 | 1/2012 | Hong et al. | |
| 8,198,380 B2 * | 6/2012 | Katayama | C08L 83/04 525/477 |
| 8,399,592 B2 | 3/2013 | Manabe et al. | |
| 8,791,496 B2 * | 7/2014 | Katayama | C08L 83/04 156/60 |
| 8,969,910 B2 * | 3/2015 | Katayama | C08L 83/04 156/60 |
| 9,556,313 B2 * | 1/2017 | Kong | C08K 5/56 |
| 9,850,409 B2 * | 12/2017 | Zhang | C08K 5/5419 |
| 2010/0225010 A1 * | 9/2010 | Katayama | C08L 83/04 257/791 |

(Continued)

FOREIGN PATENT DOCUMENTS

| | | |
|---|---|---|
| EP | 0235294 A1 | 9/1987 |
| JP | 2007154008 | 6/2007 |

(Continued)

OTHER PUBLICATIONS

International Search Report and Written Opinion of the International Searching Authority issued in connection with International Patent Application No. PCT/CN2014/080578 dated Jan. 26, 2015.

*Primary Examiner* — Sing P Chan
(74) *Attorney, Agent, or Firm* — Steven C. Bauman

(57) ABSTRACT

The present invention relates to one-component UV and thermal curable temporary adhesives for use in high temperature applications, and particularly to adhesives for the temporary attachment of one substrate to another substrate, the adhesives comprising (i) the partial hydrosilylation reaction product of the reaction between the vinyl groups on 1,3,5,7-tetravinyl-1,3,5,7-tetramethylcyclotetrasiloxane and the terminal Si—H hydrogens on a silane or siloxane having terminal Si—H hydrogens, and (ii) a photo and/or thermal radical cure initiator. Also encompassed are assemblies including such an adhesive and methods of using the adhesives.

10 Claims, No Drawings

(56) References Cited

U.S. PATENT DOCUMENTS

| | | |
|---|---|---|
| 2010/0316845 A1 | 12/2010 | Rule et al. |
| 2011/0318938 A1 | 12/2011 | Takeuchi et al. |
| 2013/0020610 A1* | 1/2013 | Katayama ............... C08L 83/04 257/100 |
| 2014/0171579 A1* | 6/2014 | Katayama ............... C08L 83/04 524/500 |
| 2016/0372641 A1* | 12/2016 | Xing ...................... C08G 77/12 |
| 2017/0081574 A1* | 3/2017 | Hynes .................... C09J 183/14 |
| 2017/0283671 A1* | 10/2017 | Hynes ........................ C09J 5/06 |

FOREIGN PATENT DOCUMENTS

| | | |
|---|---|---|
| JP | 2014012769 A | 1/2014 |
| WO | 00/40648 A1 | 7/2000 |
| WO | 2008133138 | 11/2008 |
| WO | 2013181801 A1 | 12/2013 |
| WO | 2015000150 A1 | 1/2015 |
| WO | 2015196345 A1 | 12/2015 |

* cited by examiner

1K UV AND THERMAL CURE HIGH TEMPERATURE DEBONDABLE ADHESIVE

The present invention relates to one-component UV and thermal curable temporary adhesives for use in high temperature applications, and particularly to adhesives for the temporary attachment of one substrate to another substrate.

Within a number of industries, there is growing interest in the use of flexible and/or very thin substrates, for example, stainless steel, silicon wafers, glass, ceramic, polyimide and polyester films. Flexible and very thin substrates are too fragile to be handled freestanding in downstream manufacturing conditions, and must be supported on a suitable carrier to survive. After the fabrication processes are done, the substrate must be removable from the carrier undamaged, preferably at ambient temperature.

In the electronics industry, as one example, imaging displays, sensors, photovoltaics and RFIDs, increasingly require thin and/or flexible substrates for display applications for cell phones, personal digital assistants, iPads, or TVs. An exemplary substrate is a very thin (100 μm) glass packed with functionalities. The glass is processed at 300 to 500° C. to deposit thin film transistors (TFT) or at 150-400° C. to deposit indium tin oxide (ITO) as a transparent conductor. Due to the fragility of the glass and the harsh process conditions, this glass must be reinforced or protected by bonding to a more stable substrate during fabrication. Also in the piece-type approach to touch sensor manufacture, the touch sensor glasses are precut and bound to a carrier before deposition processes like those described above. Other industries such as silicon wafer manufacturing also require bonding to a carrier substrate to protect increasingly thin silicon wafers during the backgrinding process, followed by subsequent clean release.

Uses such as those described above require a high temperature stable adhesive that is easily and cleanly debondable, that permits temporary bonding at high processing temperatures, and that does not compromise handling or performance of the substrates. This is an object particularly within the electronics industry. Development of such adhesives would allow existing fabrication methods, such as for semiconductors, active matrix thin film transistors, touch membranes, or photovoltaics, to use the currently installed base of manufacturing tools and machines. However, most currently available temporary adhesives are not thermally stable at the maximum processing of the manufacturing steps, which can be as high as 400° C.

Adhesives suitable for high temperature temporary bonding applications, which can later be removed at room temperature without causing damage to the target component, would therefore advance the use of thinner or more flexible substrates across various industries.

In general, common debondable adhesives consist of two-component systems. More precisely, these two-component systems need to be mixed with further additives to prepare a proper working product prior to or in the process of application. For that reason, current compositions of that sort are compromised in their applicability and manageability due to short working times, long curing times, and, especially after opening of the container packaging, short shelf-life times.

The present invention meets the above-formulated object and overcomes existing drawbacks by providing for a one-component UV and thermal curable, high temperature stable, debondable adhesive which provides for adequate temporary adhesion of substrates to carriers at fabrication temperatures ranging from 300° C. up to 450° C. and debonds with adhesive failure at the interface of the substrate and carrier at ambient temperature without damaging the substrate.

In a first aspect, the present invention thus relates to a one-component debondable, high temperature stable adhesive composition comprising
(i) the partial hydrosilylation reaction product of the reaction between the vinyl groups on 1,3,5,7-tetravinyl-1,3,5,7-tetramethylcyclotetrasiloxane and the terminal Si—H hydrogens on a silane or siloxane having terminal Si—H hydrogens, and
(ii) a photo and/or thermal radical cure initiator.

In another aspect, the present invention also relates to an assembly of a substrate and a carrier comprising a, preferably cured, one-component debondable, high temperature stable adhesive composition as described above disposed between the substrate and the carrier.

In yet another aspect, the present invention is also directed to a method for bonding a substrate to a carrier comprising:
(a) providing a substrate and a carrier,
(b) disposing a one-component debondable adhesive according to the present invention on the substrate and/or the carrier,
(c) contacting the substrate and carrier so that the debondable adhesive is disposed between the carrier and the substrate, forming an assembly,
(d) radically curing the debondable adhesive by
 (i) heating the assembly, or
 (ii) exposing the assembly to radiation, or
 (iii) exposing the assembly to radiation followed by heating.

In still another aspect, the present invention features a method for debonding a substrate from a carrier comprising:
(a) providing a substrate and a carrier;
(b) disposing a one-component debondable adhesive as described herein on the substrate and/or the carrier;
(c) contacting the substrate and carrier so that the debondable adhesive is disposed between, forming an assembly;
(d) radically curing the debondable adhesive by
 (i) heating the assembly, or
 (ii) exposing the assembly to radiation, or
 (iii) exposing the assembly to radiation followed by heating; and
(e) mechanically separating the substrate and the carrier, optionally after allowing the assembly to come to ambient temperature and/or one or more steps of processing the substrate.

In a still further aspect, the present invention also includes the use of the compositions described herein as an adhesive, preferably for bonding a substrate and a carrier.

"Two or more", as used herein, relates to at least two and comprises 2, 3, 4, 5, 6, 7, 8, 9 or more of the referenced species.

As used within this specification and the claims, "substrate" refers to the target component for the fabrication processes, and "carrier" refers to the support structure for the "substrate".

This invention relates to a one-component adhesive composition comprising the hydrosilylation reaction product of the reaction between the vinyl groups on 1,3,5,7-tetravinyl-1,3,5,7-tetramethylcyclotetrasiloxane and the terminal Si—H hydrogens on a silane or siloxane having terminal Si—H hydrogens, and a radiation activated photo initiator and/or a thermally activated radical initiator.

The partial hydrosilylation reaction product of the reaction between 1,3,5,7-tetravinyl-1,3,5,7-tetramethyl-cyclotetrasiloxane and a silane or siloxane having terminal Si—H hydrogens will be referred to herein as a vinylcarbosiloxane or a VCS resin or a VCSR. Generally, the term "partial hydrosilylation reaction product", as used herein, refers to products of the hydrosilylation reaction between 1,3,5,7-tetravinyl-1,3,5,7-tetramethylcyclotetrasiloxane and the terminal Si—H hydrogens on a silane or siloxane having terminal Si—H hydrogens, wherein the reaction product retains at least one unreacted vinyl group. The at least one unreacted vinyl group serves as a cross-linking moiety in the subsequent curing reaction (by radical polymerization). In various embodiments, the VCSR has a molecular weight Mw of up to 200000 g/mol, preferably 1000 to 150000 g/mol. The molecular weight Mw can be determined by gel permeation chromatography (GPC) according to DIN 55672-1:2007-08 using THF as eluent.

The inventive adhesive composition maintains its adhesion at temperatures of 300° C. or greater, up to 450° C., and is mechanically debondable at room temperature at a force of about 0.1 to 5N/25 mm, preferably at a force of 0.2 to 1.5N/25 mm. The TGA weight loss is preferably less than 5% at application temperature.

In various embodiments of the described method of bonding or debonding a substrate from a carrier, the curing by heating the assembly will include applying a temperature or range of temperatures of 100° C. to 175° C. for 1 to 30 minutes. Curing by UV radiation may be done by exposing the assembly to radiation generated by a UV/Vis lamp, for example a 500 W UV/Vis lamp, for about 1 second to 4 minutes; other sources of radiation may also be used within the discretion of the practitioner. In various embodiments, heating and irradiation can be combined, optionally by applying the heating/irradiation conditions described above. Generally, those skilled in the art can readily determine suitable curing conditions by resorting to general technical knowledge or routine experimentation. The above heating and/or irradiation serves to initiate the radical cure of the VCSR by means of activating the radical initiator (catalyst). The curing conditions depend on the catalyst used and exemplary curing conditions are also described in more detail below.

The VCS resin use in the adhesives described herein is formed by partial hydrosilylation reaction of 1,3,5,7-tetravinyl-1,3,5,7-tetramethylcyclotetrasiloxane, having the structure:

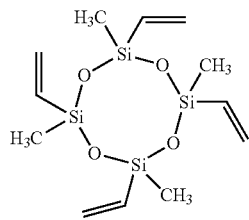

with suitable silanes or siloxanes, having at least two terminal Si—H hydrogens for reacting with the 1,3,5,7-tetravinyl-1,3,5,7-tetramethylcyclotetrasiloxane, including those having the structures:

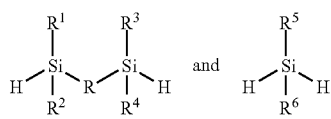

wherein R is selected from the group consisting of a $C_1$ to $C_{10}$ alkyl group, an aryl group, for example a $C_6$ to $C_{10}$ aryl group, an oxygen, —(O—SiMe$_2$)$_n$-O—, —(O—SiAr$_2$)$_n$—O—, —(O—SiMeAr)$_n$—O—, and a combination of any of these groups, in which n is an integer of at least 1, Me is a methyl group, and Ar is an aryl group, for example a $C_6$ to $C_{10}$ aryl group; and wherein each of $R^1$, $R^2$, $R^3$, $R^4$, $R^5$, and $R^6$, independently is a $C_1$ to $C_{10}$ alkyl group or an aryl group, for example a $C_6$ to $C_{10}$ aryl group. Preferred for $R^1$, $R^2$, $R^3$, $R^4$, $R^5$, and $R^6$ are $C_1$ to $C_{10}$ alkyl groups, in particular $C_1$ to $C_4$ alkyl groups, such as methyl or ethyl, or phenyl.

Exemplary silanes or siloxanes include polyalkylsilanes and polyalkyl-siloxanes in which the alkyl groups on the silicon atoms are $C_1$ to $C_{10}$ alkyl groups. In various embodiments, the silanes and siloxanes include polydialkylsiloxane, such as polydimethylsiloxane, polyalkylaryl siloxane, such as polymethylphenyl siloxane, tetraalkyldisiloxane, such as tetramethylsiloxane, and polydiarylsiloxanes. These compounds are commercially available from Gelest.

Preferred VCSR reaction products are those having the following idealized structures, in which the molecular weight is weight averaged molecular weight. In various embodiments, the alkyl groups on the silicon atoms of the VCSR reaction products include $C_1$ to $C_{10}$ alkyl groups. In the following idealized structures, methyl groups are depicted in the silane/siloxane moiety, but it should be understood that other $C_1$ to $C_{10}$ alkyl groups can be substituted.

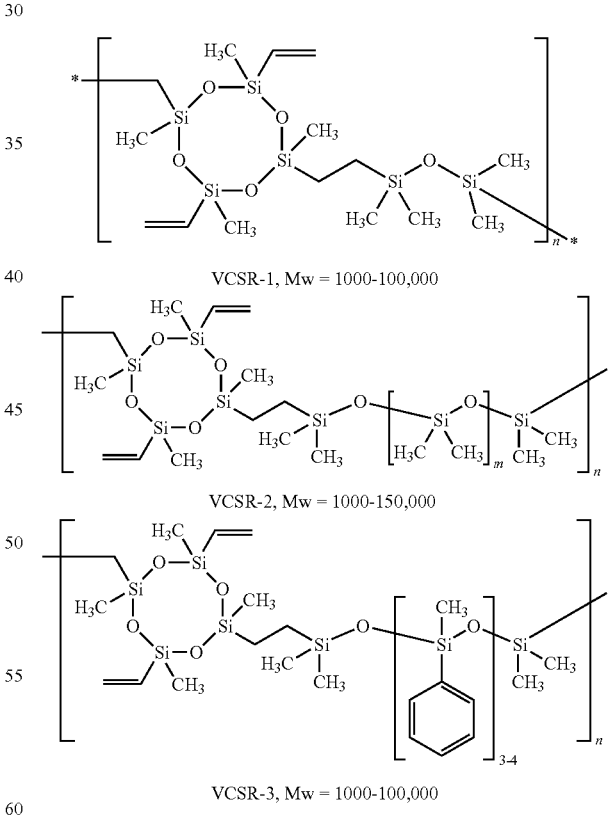

In addition to the VCSR, the adhesive composition comprises a photo initiator and/or a thermally activated radical initiator as a catalyst for curing of the VCSR by radical polymerization/cross-linking of the vinyl groups.

The photo initiator is a radiation activated radical initiator and the thermal cure radical initiator is a thermally activated radical initiator, so that the cure is a thermal or photo cure. Suitable radical initiators are well known to those skilled in the art. For example, the photo initiator and/or the thermally activated radical initiator is selected from the group consisting of α-hydroxy ketones, benzophenones, and phenyl glyoxylic acids. Also suitable are all types of acyl-phosphine oxide and bis-acyl-phosphine oxide generally known in the art, and further dicumene peroxide, cumene hydroperoxide, and 2-hydroxy-2-methyl-1-phenyl propan-1-one without limitation. A preferred radical initiator is dicumene peroxide. Preferred photoinitiators include those sold under the tradenames Darocure® 1173 and Irgacure® 184 (1-Hydroxy-cyclohexyl-α-Hydroxyketone) or 2100 (blend of monoacylphosphine oxide (MAPO) and bisacylphosphine oxide (BAPO)).

In many reactions, the level of catalyst can still be active and yet be low enough so that it is not necessary to separate it from the reaction product.

In various embodiments, the compositions comprise based on the total weight of the composition 40 to 95 wt %, preferably 60 to 85 wt %, of the VCSR and/or 0.1 to 10 wt %, preferably 0.1 to 2 wt % of the radiation activated photo initiator and/or a thermally activated radical initiator.

Typical curing conditions include exposure to UV/Vis radiation and/or heat with temperatures less than 200° C. The energy input is preferably in the range of 2000-20.000 mJ/cm$^2$, preferably 7000-12.000 mJ/cm$^2$.

The composition may further comprise a cure speed aid, such as methacrylated or acrylated siloxanes. The amount of such additives usually ranges from about 0 to 50 wt %, preferably 5 to 15 wt %, relative to the total weight of the composition.

Also included may be various filler materials, including but not limited to silica. If present, such fillers may be present in amounts of 0 to 40 wt %, preferably 5 to 25 wt %, based on the total weight of the composition.

The compositions of the present invention do not require the addition of additional crosslinkers, in particular hydrosilane and/or hydrosiloxane crosslinkers. Accordingly, in preferred embodiments, the compositions of the invention are free of such additional crosslinkers, in particular free of hydrosilane and hydrosiloxane crosslinkers. "Free of", as used in this context, means that the amount of the referenced species in the composition is less than 1 wt %, preferably less than 0.1 wt %, based on the total weight of the composition.

As described herein, the bonded assembly consisting of carrier, substrate and cured adhesive bonding the carrier to the substrate can be subjected to further processing steps of the substrate. The processing steps may, for example, involve exposure to temperatures of 300 to 500° C. to deposit thin film transistors (TFT) or 150 to 400° C. to deposit indium tin oxide (ITO) as a transparent conductor. In various embodiments, the substrate is a glass substrate or silicon wafer, for example an ultrathin glass or wafer having a thickness of below 0.5 mm, preferably of 100 μm or less. The bonding of the substrate to the carrier during said processing steps reinforces and protects the substrate. The carrier can be made of any suitable material, including metal, glass, plastics and ceramics. In other embodiments, the carrier may also be a substrate, for example as defined above.

After said processing steps are completed, the assembly may be cooled and the carrier and the substrate be mechanically separated from each other. In this mechanical separation step, also referred to herein as "debonding", the separation occurs with adhesive failure at the interface of the substrate and carrier at ambient temperature without damaging the substrate.

The present invention further encompasses the use of the compositions described herein as debondable adhesives, in particular for reversibly bonding a substrate and a carrier to each other. The uses may include similar steps as the methods that have been described above.

Generally, it should be understood that all embodiments disclosed herein in relation to the compositions of the invention are equally applicable to the disclosed methods and uses and vice versa.

EXAMPLES

Comparative Example 1

Current 2 k Formulations

Formulation

A two-part formulation with Part A containing 72.5% VCSR2 (containing Pt catalyst), 6.5% fumed silica, 5% PDV-0535, and 1% Darocure 1173, Part B with SIB 6826.0 hydrosiloxane from Gelest. Part A was mixed with part B in a 85:15 weight ratio. Some of the mixed sample was put into a glass vial. The glass vial was placed into UVLOC 1000 and submitted to UV exposure for 80 s (about 8000-12000 mJ/cm$^2$), then the UV pre-cured sample was placed into an oven at 150° C. to conduct post thermal cure for 15 min. Finally, the cured sample was a clear solid. The TGA (thermogravimetric analysis) of this sample showed 97.5% of the mass remained after 30 min at 350° C. (ramp rate of 20° C./min from room temperature).

Debond Peel Force

The above formulation was coated on a standard glass slide (75×25×1 mm) and a cover slide (50×24×0.1 mm) on cross position (bonded area 25×24 mm). Then the assembly was subjected to a simple peel force test after UV-heat cure, followed by heat aging at 250° C. for 1 h, at 350° C. for 10 min and thereafter cooling to room temperature. A force gauge was attached to the thin glass slide and the bond subjected to an approximate 90 degree peel force. The bond was easily broken with a force of 1-3 Newton with the thin glass slide intact.

Cracking after Aging

A sample (0.1 ml approx.) of the above formulation was placed on a 50×80×1 mm glass slide. 150 microns spacers were placed on either end of the slide and an identical glass slide was placed over the sample supported by the spacers to afford an approximate bond gap of 150 microns. The sample was cured in UVLOC 1000 for 80 s and in an oven at 150° C. for 10 min, then was removed to room temperature. After heat aging, the room temperature adhesive sample was clear and crack free.

Viscosity Stability/Pot Life

A viscosity monitoring test over time was conducted on the above formulation, using Brookfield viscometer (dynamic) (RVT DV-II CP#5 2.5 rpm, 25° C.). Part A was mixed with part B in a speed mixer, then the viscosity was tested after 0 h, 0.5 h, 1.5 h, and 2 h. The results (table 1) showed that the two-component formulation had a very short pot life, therefore difficult to apply in manufacturing.

TABLE 1

| Viscosity of 2k-formulation over time | | | |
|---|---|---|---|
| Mixture 0 h | Mixture 0.5 h | Mixture 1.5 h | Mixture 2 h |
| 8533 cps | 8998 cps | 11470 cps | 12462 cps |

Example 2

Inventive 1 k Formulation

A new one-part formulation was developed to overcome the shortage of the short pot-life of two-part systems, moreover benefiting the application process in manufacturing. There is no need for mixing of different components before application of the adhesive to the substrate. Moreover, packaging is simplified.

Formulation

The new formulation with VCSR2 containing 12.5% PDV-0535, 5.5% fumed silica, 0.2% dicumyl peroxide, and 1% Darocure 1173 was put into a glass vial. The glass vial was placed in the speed mixer at 2000 rpm for 1 min. Then, the glass vial was put into UVALOC 1000 and under 500 W UV exposure for 80 s (about 8000-12000 mJ/cm$^2$), then the UV pre-cured sample was fully cured at 150° C. for 15 min. The cured sample was a clear solid. The TGA of this sample showed 96.8% of the mass remained after 30 min at 350° C. (ramp rate of 20° C./min from room temperature). This is an approximately equivalent outgassing performance compared to Example 1.

Debond Peel Force

A sample (0.1 ml approx.) of the above formulation was placed on a 50×80×1 mm glass slide. 150 micron spacers were placed on either end of the slide and an identical glass slide was placed over the sample supported by the spacers to afford an approximate bond gap of 150 microns. The sample was cured with UCLOC 1000 for 80 s, and in an oven at 150° C. The resulting clear bonded glass sample was placed in an oven at 250° C. for 1 h and 350° C. for 10 min, then removed to room temperature. After heat ageing, the room temperature adhesive sample was clear and crack free.

Viscosity Stability/Pot Life

Viscosity was traced over several weeks by Brookfield viscometer (dynamic) (RVT DV-II CP#5 2.5 rpm, 25° C.), viscosity of the initial fresh sample was 7966 cps, and 12 d later the viscosity was still stable at 7542 cps. The pot life issue obvious with Example 1 is overcome completely.

What is claimed is:

1. A one-component debondable, high temperature stable adhesive composition comprising
   (i) a partial hydrosilylation reaction product of a reaction between vinyl groups on 1,3,5,7-tetravinyl-1,3,5,7-tetramethylcyclotetrasiloxane and terminal Si—H hydrogens on a silane or siloxane having terminal Si—H hydrogens; and
   (ii) a photo and/or thermal radical cure initiator.

2. The debondable adhesive composition according to claim 1 in which the silane or siloxane having terminal Si—H hydrogens has a structure

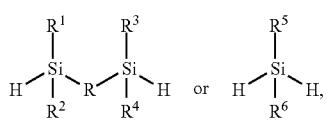

wherein R is selected from the group consisting of a $C_1$ to $C_{10}$ alkyl group, an aryl group, an oxygen, —(O—SiMe$_2$)$_n$-O—, —(O—SiAr$_2$)$_n$—O—, —(O—SiMeAr)$_n$—O—, and a combination of any of these groups, in which n is an integer of at least 1, Me is a methyl group, and Ar is an aryl group; and in which each of $R^1$, $R^2$, $R^3$, $R^4$, $R^5$, and $R^6$, independently is a $C_1$ to $C_{10}$ alkyl group or an aryl group.

3. The debondable adhesive composition according to claim 2 in which the silane or siloxane having terminal Si—H hydrogens is selected from the group consisting of polydialkylsiloxane, polyalkylaryl siloxane, tetraalkyldisiloxane, and polydiaryl siloxane.

4. The debondable adhesive composition according to claim 1, wherein the radical cure initiator is selected from the group consisting of α-hydroxy ketones, benzophenones, phenyl glyoxylic acids, acyl-phosphine oxides, bis-acyl-phosphine oxides, dicumene peroxide, cumene hydroperoxide, and 2-hydroxy-2-methyl-1-phenyl propan-1-one.

5. The debondable adhesive composition according to claim 1, further comprising a cure speed aid selected from acrylated and/or methacrylated siloxanes.

6. The debondable adhesive composition according to claim 1, further comprising a filler material.

7. The debondable adhesive composition according to claim 1, wherein the composition is free of additional crosslinkers, preferably free of hydrosilane and hydrosiloxane crosslinkers.

8. An assembly of a substrate and a carrier, comprising a one-component debondable, high temperature stable adhesive composition according to claim 1 disposed between the carrier and the substrate.

9. A method for bonding a substrate to a carrier comprising:
   (a) providing a substrate and a carrier,
   (b) disposing a one-component debondable adhesive composition according to claim 1 on the substrate and/or the carrier,
   (c) contacting the substrate and carrier so that the debondable adhesive composition is disposed between the carrier and the substrate, forming an assembly,
   (d) radically curing the debondable adhesive by
      (i) heating the assembly, or
      (ii) exposing the assembly to radiation, or
      (iii) exposing the assembly to radiation followed by heating.

10. A method for debonding a substrate from a carrier comprising:
   (a) providing a substrate and a carrier;
   (b) disposing a one-component debondable adhesive composition according to claim 1 on the substrate and/or the carrier;
   (c) contacting the substrate and carrier so that the debondable adhesive composition is disposed between the carrier and the substrate, forming an assembly;
   (d) radically curing the debondable adhesive by
      (i) heating the assembly, or
      (ii) exposing the assembly to radiation, or
      (iii) exposing the assembly to radiation followed by heating; and
   (e) mechanically separating the substrate and the carrier, optionally after allowing the assembly to come to ambient temperature and/or one or more steps of processing the substrate.

* * * * *